(12) United States Patent
Frahm et al.

(10) Patent No.: US 7,313,208 B2
(45) Date of Patent: Dec. 25, 2007

(54) PRE-EQUALIZATION FOR LOW-COST DTV TRANSLATORS

(75) Inventors: Timothy V. Frahm, Palatine, IL (US); Gary J. Sgrignoli, Mt. Prospect, IL (US)

(73) Assignee: Zenith Electronics Corporation, Lincolnshire, IL (US)

( * ) Notice: Subject to any disclaimer, the term of this patent is extended or adjusted under 35 U.S.C. 154(b) by 834 days.

(21) Appl. No.: 10/700,124

(22) Filed: Nov. 3, 2003

(65) Prior Publication Data

US 2005/0094752 A1    May 5, 2005

(51) Int. Cl.
*H04B 1/10* (2006.01)

(52) U.S. Cl. .............. 375/350; 375/279; 375/295; 375/229; 375/301; 348/608; 348/722; 348/723; 348/724; 348/470

(58) Field of Classification Search ............ 375/279, 375/295, 350, 229, 301; 348/608, 722, 723, 348/724, 470, 707, 21
See application file for complete search history.

(56) References Cited

U.S. PATENT DOCUMENTS

| | | | |
|---|---|---|---|
| 6,281,936 B1 * | 8/2001 | Twitchell et al. | 348/470 |
| 6,320,463 B1 * | 11/2001 | Leva et al. | 330/149 |
| 6,335,767 B1 * | 1/2002 | Twitchell et al. | 348/608 |
| 6,515,712 B1 * | 2/2003 | Jeong | 348/608 |
| 6,600,516 B1 * | 7/2003 | Danielsons et al. | 348/608 |
| 6,751,266 B1 * | 6/2004 | Danielsons | 375/296 |
| 6,917,389 B2 * | 7/2005 | Lee | 348/608 |
| 2004/0008764 A1 * | 1/2004 | Seo et al. | 375/229 |

* cited by examiner

*Primary Examiner*—Chieh M. Fan
*Assistant Examiner*—Siu M Lee

(57) ABSTRACT

A low cost DTV translator, which translates an incoming signal on channel A to an outgoing signal on channel B, includes a transmitter pre-equalizer whose taps are configured with tap values that pre-distort a signal so as to negate distortion caused by a high power amplifier and emission mask filter at the output of the DTV translator. This pre-distortion is accomplished by using the transmitter of the DTV translator to provided a reference signal and to use the receiver of the DTV translator as a reference receiver for the reference signal to thereby avoid the use of a more expensive external reference receiver.

23 Claims, 3 Drawing Sheets

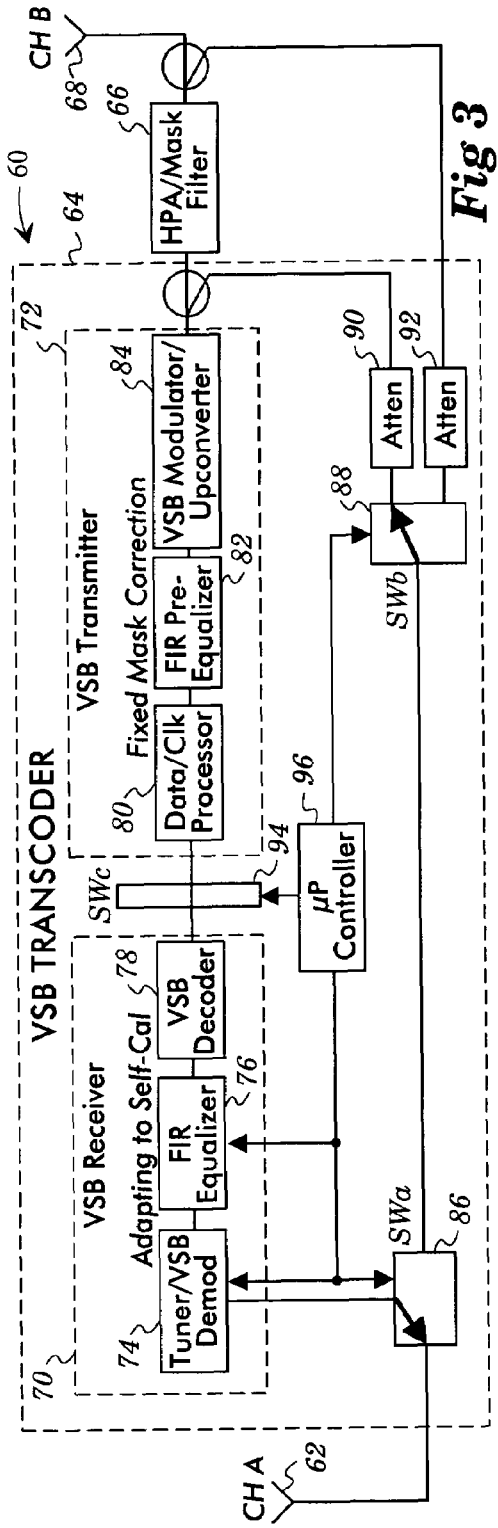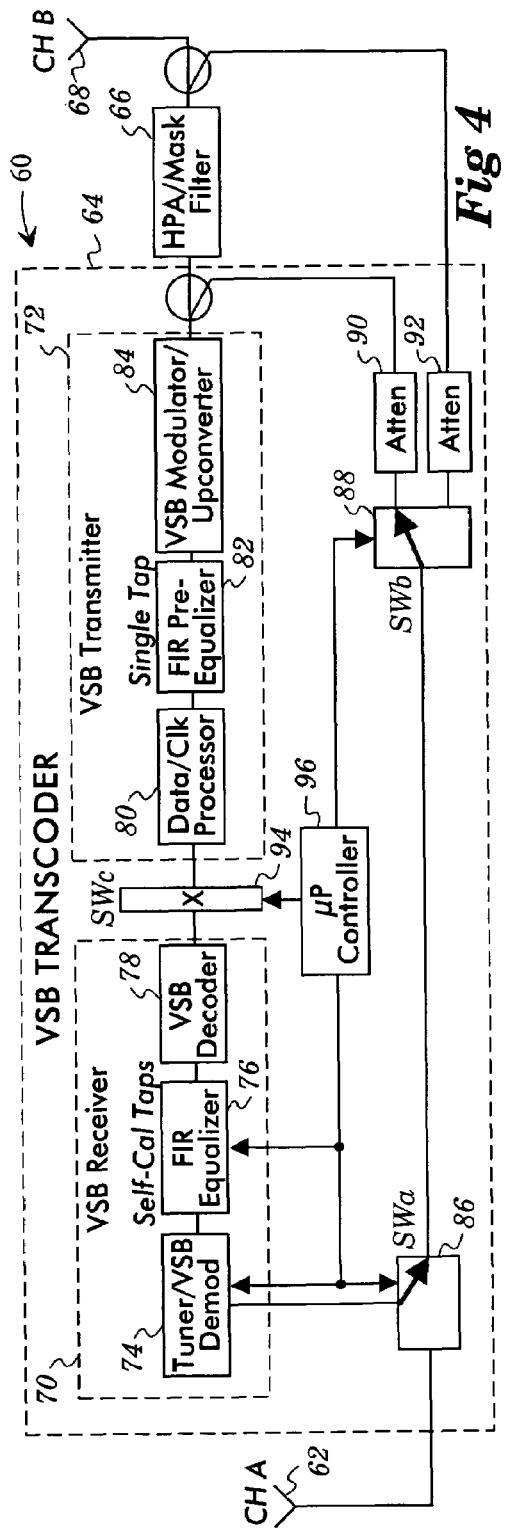

PRE-EQUALIZATION FOR LOW-COST DTV TRANSLATORS

TECHNICAL FIELD OF THE INVENTION

The present invention relates to a digital television (DTV) translator having pre-correction so as to pre-correct for signal distortion such as signal distortion caused by the DTV translator. This signal distortion may be caused, for example, by the high power amplifier and emission mask filter of the DTV translator.

BACKGROUND OF THE INVENTION

Currently, many full-service DTV stations perform both linear and non-linear distortion correction while the transmitter is "on-line" (i.e., while the desired DTV signal is being transmitted over-the-air). Distortion may be caused, for example, by certain elements, such as the power amplifier, of the transmitter of a DTV station. A separate, accurate, and costly reference receiver is often used to accurately measure this distortion. Correction information based on the measured distortion is then loaded into the DTV modulator to pre-distort the VSB signal. Accordingly, the pre-distortion of the VSB signal negates the distortion caused by the transmitter so as to provide a clean output signal to the transmit antenna. However, cost prohibits the use of this reference receiver in inexpensive DTV translators.

Digital 8-VSB has been the U.S. standard for digital television transmission since December 1996 when the FCC selected the ATSC standard (minus table 3) as the 6 MHz digital transmission standard for this country. Likewise, MPEG-2 video coding and Dolby's AC-3 audio coding were also selected as part of the standard along with MPEG transport data stream protocols. Volunteer DTV stations began transmitting digital 8-VSB in November of 1998, with the official start for commercial DTV stations beginning in May 1999. The VSB transmission system is described in the document entitled "ATSC Digital Television Standard—A/53B", and can be found on the ATSC website (www.atsc.org).

Full service DTV stations in the U.S. typically meet the ATSC recommended compliance factors as specified in ATSC document A/64A. These factors include recommendations for both in-band signal quality as well as adjacent channel splatter interference. The in-band signal quality is often described in terms of signal-to-noise ratio/modulation-error-ratio (SNR/MER), which describes the "openness" of the data eyes in the presence of the transmitter's linear and non-linear distortion (white Gaussian thermal noise in a transmitter is not a consideration). Typically, these full service stations have completely separate test equipment to not only measure the signal quality for compliance, but also to correct the linear and non-linear distortion in the transmitter by pre-distorting the signal in the VSB modulator. This test equipment is typically of instrument-grade quality and very expensive.

FIG. 1 illustrates a typical full service DTV station 10, with an MPEG transport stream as an input and a VSB-modulated RF signal as an output. The DTV station 10 includes a transmitter 12 having a VSB modulator 14, an RF upconverter 16, and a high power amplifier 18. The VSB modulator 14 modulates the MPEG transport stream as a VSB signal, usually an 8 VSB signal. The output of the VSB modulator 14 is upconverted by the RF upconverter 16 to the frequency corresponding to the output channel of the DTV station 10, and the upconverted signal is amplified by the high power amplifier 18. The DTV station 10 also includes an emission mask filter 20 that is typically a narrow bandpass filter to confine the signal to be up linked by a device such as an antenna 22 to the correct channel bandwidth. As suggested previously, the high power amplifier 18 and/or the emission mask filter 20 distorts the signal to be up linked by the antenna 22.

Therefore, the DTV station 10 also includes a reference VSB receiver 24. The reference VSB receiver 24 is shown as an external piece of equipment, separate from the transmitter 12 itself, so that the broadcaster can independently and accurately measure the signal to be transmitted. To this end, the reference VSB receiver 24 receives the signal to be transmitted by way of a directional coupler 26, measures the received signal, and supplies correction data to the taps of a correction filter in the transmitter 12 to compensate for linear distortion imposed by the high power amplifier 18 and/or the emission mask filter 20. The reference VSB receiver 24 operates "on-line", that is, while the DTV signal is being transmitted by the DTV station 10, and without service interruption.

There are some manufacturers who place a separate reference receiver inside their transmitters. However, correction is typically not obtained with the same accuracy as that obtained from an external piece of instrument-grade test equipment.

The cost, in either case, is not insignificant. However, since full service DTV stations buy very expensive transmitters, this cost is not prohibitive for many of those stations.

DTV translators, on the other hand, are very small and inexpensive receiver/transmitter units placed at key locations in or beyond the service area of full service DTV stations to provide better signal levels and signal quality to terrain shielded areas. They are often placed on "mountain top" sites, providing signals to terrain shielded valleys.

The primary purposes of DTV translators are to essentially relay the MPEG transport data unprocessed (except for a few minor PSIP changes in the transport stream for identification purposes), and to translate the incoming DTV signal to a new channel frequency. There are two types of DTV translators: heterodyne and regenerative. The heterodyne type of DTV translator just mixes the incoming RF signal on RF channel A down to an IF frequency, bandpass filters it, and then upconverts it to the new RF channel B. No equalization (ghost canceling) is performed, nor is any error correction performed on the data. Therefore, the signal quality is not improved, but rather is the same or worse at its output.

The regenerative type of DTV translator actually decodes the VSB signal, performs both equalization and error correction, and then re-modulates and upconverts the MPEG-transport data to the new RF channel. More specifically, the regenerative type of DTV translator provides the following functions: select the desired DTV signal on the appropriate incoming RF channel, rejecting any interference signals (Tuner/Demod); remove any multipath from the signal (Equalizer); perform error correction and decoding to obtain an error-free transport data stream (VSB Decoder); perform simple PSIP data processing on the transport stream and regenerate the data clock (Data/Clock Processor); encode and re-modulate the data as a "pristine" 8T-VSB modulated signal at IF (VSB Modulator); upconvert the modulated signal to a new DTV channel frequency (Upconverter); and, amplify and (emission mask) filter the final output signal for transmission (High Power Amp/Mask Filter).

A typical regenerative DTV translator 30 is shown in FIG. 2, which contains a receive antenna 32, a VSB transcoder 34, a high power amplifier (HPA) and emission mask filter 36, and a transmit antenna 38. The VSB transcoder 34 is made up of two parts: a VSB receiver 40 and a VSB transmitter 42. The VSB receiver 40 includes a tuner and VSB demodulator 44, an equalizer 46, and a VSB decoder 48. The VSB receiver 40 is essentially identical to that found in consumer DTV sets, and provides an error-free MPEG transport data stream if the RF input signal is above the threshold of errors. The tuner and VSB demodulator 44 converts the RF signal first to IF and then demodulates the IF signal to baseband, rejecting any adjacent channel interfering analog NTSC or digital ATSC signals on other channels. The equalizer 46 specifically removes multipath ("ghosting") effects that occur in propagation, and is typically configured as a combination of a finite-impulse-response (FIR) filter and a decision-feedback equalizer (DFE) circuit, which is essentially an infinite-impulse-response (IIR) filter. The VSB decoder 48 performs decoding, de-interleaving, de-randomization, and error-correction, providing an error-free transport data stream for VSB re-transmission. The MPEG transport data stream can also be used locally for decoding to baseband video and audio, if needed, at the translator site for NTSC re-transmission during the transition years.

The VSB transmitter 42 includes a data and clock processor 50, a pre-equalizer 52, and a VSB modulator and upconverter 54. The VSB transmitter 42 is similar to that found in a full-service commercial DTV transmitter. The data and clock processor 50 manipulates a few data packets in the transport streams (such as the "virtual channel" and "short name") and locks the transmitter symbol clock to the incoming symbol clock (which can clean up any existing clock jitter present from the source full-service transmitter or created during propagation). The optional (short) pre-equalizer 52 is typically a FIR filter that corrects for any linear distortion in the output of the transmitter's high power amplifier and emission mask filter 36. As an example, this tapped-delay-line FIR filter with variable gain coefficients may contain 32 taps. The VSB modulator and upconverter 54 performs the VSB coding (randomization, interleaving, Reed-Solomon coding, trellis-coded modulation) and creates the pristine 6 MHz bandwidth IF data spectrum before being upconverted to the desired RF channel. The taps of the pre-equalizer 52 can be set by an external reference receiver such as the reference VSB receiver 24 shown in FIG. 1.

A controller (not shown) controls the typical functions, such as tuning, of the VSB transcoder 34.

There are two types of signal distortion that the RF output signal of the DTV translator may contain: linear and non-linear. While full service DTV station transmitters often remove both of these types of distortion automatically, the technology does not exist to remove this distortion automatically in a low-cost DTV translator. If needed, some of the non-linear distortion may be removed manually in the low-level analog IF circuits of the translator's exciter.

Since regenerative translators actually decode and error-correct the baseband transport data stream, the primary source of linear distortion in the output of the DTV translator is typically the narrow emission mask bandpass filter, whose main purpose is to remove the amplifier's adjacent channel splatter energy caused by any non-linearities. However, translator equipment cost prohibits the use of an expensive external reference receiver such as that shown in FIG. 1 to determine the correction taps needed to pre-distort the signal and essentially pre-equalize the entire translator for linear distortion.

The present invention is directed to performing correction in a low cost DTV translator. If desired, this correction can be done using essentially the same components as found in typical regenerative DTV translators, with only a handful of additional miscellaneous passive components.

SUMMARY OF THE INVENTION

In accordance with one aspect of the present invention, a method is provided to pre-correct a DTV translator for distortion produced by a high power amplifier and emission mask filter of the DTV translator. The DTV translator has a receiver and a transmitter. The method comprises the following: coupling an output of the high power amplifier and emission mask filter to the receiver; tuning the receiver to the output of the high power amplifier and emission mask filter; and, pre-correcting the DTV translator in response to the tuned signal.

In accordance with another aspect of the present invention, a method of calibrating a receiver of a DTV translator having the receiver and a transmitter comprises the following: coupling an output of the transmitter to the receiver; tuning the receiver to the output of the transmitter; and, calibrating the receiver in response to the tuned signal.

In accordance with still another aspect of the present invention, a method is provided to pre-correct a DTV translator for distortion produced by a high power amplifier and emission mask filter of the DTV translator. The DTV translator has a receiver and a transmitter. The method comprises the following: coupling an output of the transmitter to the receiver; tuning the receiver to the output of the transmitter; calibrating the receiver in response to the tuned transmitter output signal; transferring the calibration to the transmitter; coupling an output of the high power amplifier and emission mask filter to the receiver; tuning the receiver to the output of the high power amplifier and emission mask filter; and, pre-correcting the DTV translator in response to the tuned high power amplifier and emission mask filter output signal.

In accordance with yet another aspect of the present invention, a DTV translator comprises a receiving antenna that receivers channel A, a transmitting antenna that transmits channel B different than channel A, a receiver including a tuner and an equalizer, a transmitter including a pre-equalizer and a transmitter output, a high power amplifier and emission mask filter coupled between the transmitter output and the transmitting antenna and having a high power amplifier and emission mask filter output, first, second, and third switches, and a controller. The transmitter outputs channel B. The first switch is coupled to the receiving antenna and to the tuner. The second switch is coupled to the transmitter output, to the high power amplifier and emission mask filter output, and to the first switch. The third switch is coupled between the receiver and the transmitter. The controller during normal operation tunes the tuner to channel A and operates the first and third switches to couple the receiving antenna to the tuner and to couple the receiver to the transmitter. The controller during pre-distortion (i) operates the first, second, and third switches to couple the transmitter output to the tuner and to disconnect the receiver from the transmitter, (ii) tunes the tuner to the transmitter output such that taps of the equalizer adjust to calibration values that reduce receiver related distortion, (iii) transfers the calibration values from the equalizer to the taps of the pre-equalizer, (iv) operates the first, second, and third switches to couple the high power amplifier and emission mask filter output to the tuner and to disconnect the receiver from the transmitter, (v) tunes the tuner to the high power amplifier and emission mask filter output such that the taps of the equalizer adjust to pre-distortion values that reduce high power amplifier and emission mask filter related distortion, and (vi) transfers the pre-distortion values from the equalizer to the taps of the pre-equalizer.

BRIEF DESCRIPTION OF THE DRAWINGS

These and other features and advantages of the present invention will become more apparent from a detailed consideration of the invention when taken in conjunction with the drawings in which:

FIG. 3 illustrates a DTV translator that includes a receiver, a transmitter, and a high power amplifier and mask emission filter, that is equipped to pre-correct for distortion caused by the high power amplifier and mask emission filter, and that is configured for normal operation;

FIG. 4 illustrates the DTV translator of FIG. 3 configured for pre-calibrating the receiver equalizer for tuner related distortion;

DETAILED DESCRIPTION

Figure 1:
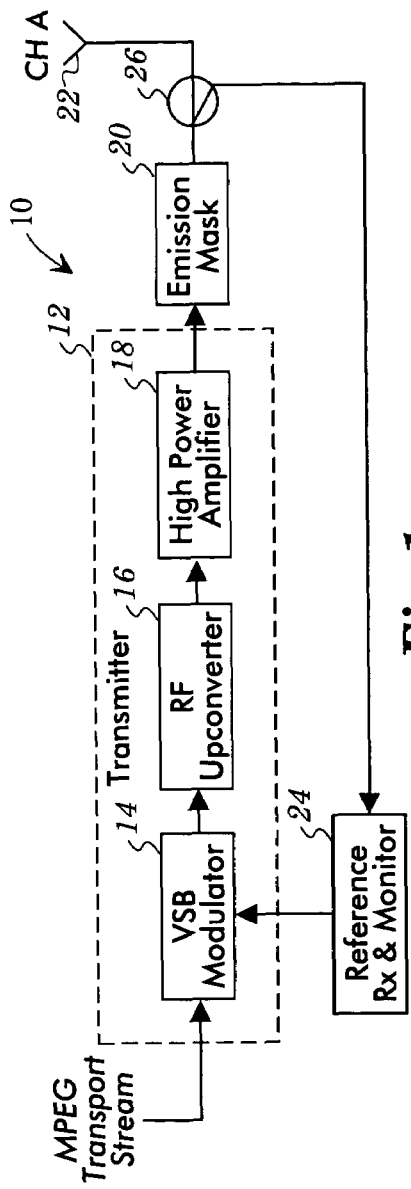
FIG. 1 illustrates a typical DTV transmitter that includes an external reference receiver used for pre-correction of distortion caused by elements of the DTV transmitter.
Figure 2:
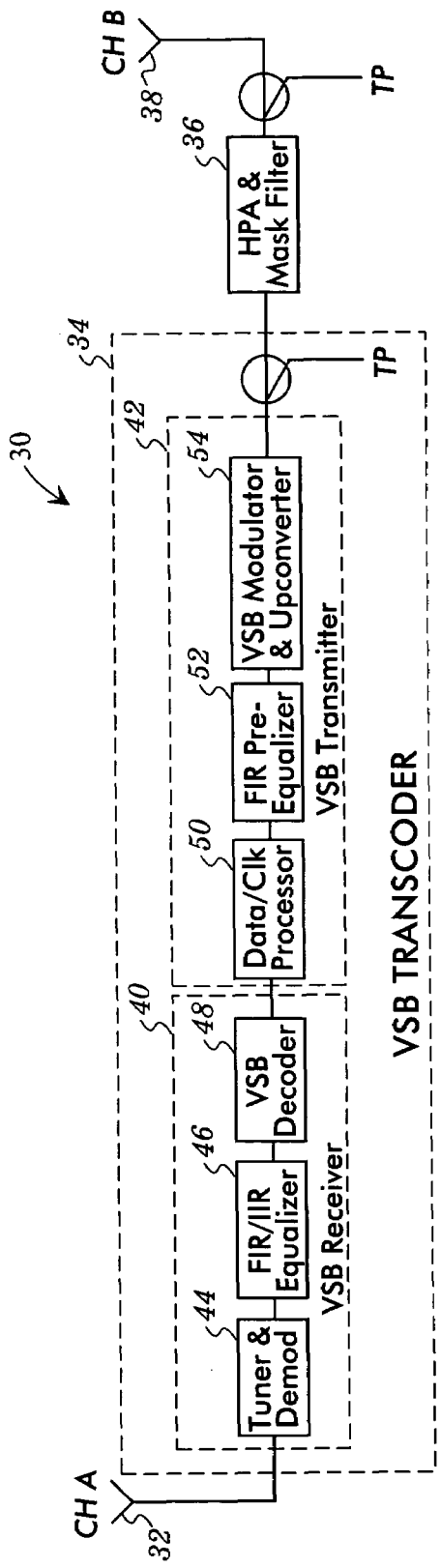
FIG. 2 illustrates a typical DTV translator that includes a receiver, a transmitter, and a high power amplifier and mask emission filter.

In one embodiment of the present invention, the process of pre-equalizing linear distortion in a low cost DTV translator comprises using the on-board VSB transmitter as an accurate VSB reference source and using the on-board VSB receiver as an accurately calibrated reference receiver. The first requirement of a "clean" reference source may be achieved naturally in an all-digital design of the VSB modulator (followed by "transparent" upconversion to the desired RF output channel). The second requirement of an ideal (accurate) reference receiver is not achieved with the low-cost VSB receiver found in translators. However, the accurate VSB transmitter may be used to calibrate the less accurate VSB receiver before determining the correction needed for the emission mask's linear distortion. Because the VSB transmitter and receiver in the translator are being used to do this linear distortion correction, this process must be performed "off-line." That is, the RF input signal must be temporarily (for a short time) disconnected from the translator input so that it is not re-transmitted on the desired upconverted RF channel during the automated pre-equalization process.

The three basic steps for pre-equalization are as follows: use the accurate (e.g., SNR≧33 dB) on-board VSB transmitter to self-calibrate the VSB receiver; use the self-calibrated receiver to determine the high power amplifier/emission mask correction; and, use the correction information to pre-distort (pre-equalize) the VSB transmitter output. An optional fourth step is as follows; re-load the original VSB receiver self-calibration information into the receiver equalizer to accurately measure and verify the translator pre-equalization performance.

FIGS. 3-6 illustrate a DTV translator 60 that implements the above steps. It is noted that the DTV translator 60 includes basically the same components as those found in the DTV translator 30. Accordingly, the DTV translator 60 contains a receive antenna 62, a transcoder 64, a high power amplifier (HPA) and emission mask filter 66, and a transmit antenna 68. The VSB transcoder 64 is made up of two parts: a VSB receiver 70 and a VSB transmitter 72. The VSB receiver 70 includes a tuner and VSB demodulator 74, an adaptive equalizer 76, and a VSB decoder 78. The tuner and VSB demodulator 74 converts the incoming RF signal first to IF and then demodulates the IF signal to baseband, rejecting any adjacent channel interfering analog NTSC or digital ATSC signals on other channels. The adaptive equalizer 76 specifically removes multipath ("ghosting") effects that occur in propagation, and is typically configured as a combination of finite-impulse-response (FIR) filter and a decision-feedback equalizer (DFE) circuit, which is essentially an infinite-impulse-response (IIR) filter. The VSB decoder 78 performs decoding, de-interleaving, de-randomization, and error-correction, providing an error-free transport data stream for VSB re-transmission. The MPEG transport data stream can also be used locally for decoding to baseband video and audio, if needed, at the translator site for NTSC re-transmission during the transition years.

The VSB transmitter 72 includes a data and clock processor 80, a pre-equalizer 82, and a VSB modulator and upconverter 84. The data and clock processor 80 manipulates a few data packets in the transport streams (such as the "virtual channel" and "short name") and locks the transmitter symbol clock to the incoming symbol clock (which can clean up any existing clock jitter present from the source full-service transmitter or created during propagation). The pre-equalizer 82 is typically a FIR filter that pre-corrects for any linear distortion in the output of the transmitter's high power amplifier and emission mask filter 66. As an example, this tapped-delay-line FIR filter with variable gain coefficients may contain 32 taps. The VSB modulator and upconverter 84 performs the VSB coding (randomization, interleaving, Reed-Solomon coding, trellis-coded modulation) and creates the pristine 6 MHz bandwidth IF data spectrum before being upconverted to the desired RF channel.

The only additional components in the DTV translator 60 over the DTV translator 30 are an input RF switch 86, a reference RF switch 88, and a transcoder output attenuator 90, a translator output attenuator 92, and a clock and data switch 94, all of which are inexpensive passive components.

FIG. 3 shows the normal operation of the DTV translator 60. During normal operation, the input RF switch 86 is set to couple the incoming signal from the receive antenna 62 to the tuner and VSB demodulator 74, while the reference RF switch 88 is arbitrarily set to couple to the output of the VSB modulator and upconverter 84 through the transcoder output attenuator 90. The clock and data baseband switch 94 is closed, passing data and clock from the output of the VSB receiver 70 to the input of the VSB transmitter 72. With the tuner and VSB demodulator 74 tuned to the desired incoming RF channel (CH A), the DTV translator 60 behaves normally such that the incoming RF signal is received, equalized, decoded, and error-corrected before PSIP processing, signal pre-equalization, re-modulation, and re-transmission on the outgoing channel (CH B) are performed by the VSB transmitter 72. The transcoder output attenuator 90 and the translator output attenuator 92 reduce the large signal level to appropriate levels that the tuner and VSB demodulator 74 can handle, and provide a good termination to their respective sources when the reference RF switch 88 is not connecting their outputs to the tuner and VSB demodulator 74.

The following steps describe the operation of the pre-equalization process, which is controlled by a controller 96. The controller 96, for example, may be a microprocessor suitably programmed to perform these steps automatically.

Step 1 (CALIBRATION)—as illustrated in FIG. 4, the controller 96 at the beginning of the pre-equalization process operates the input RF switch 86 to disconnect the incoming RF signal at the receive antenna 62 from the tuner and VSB demodulator 74, and operates the reference RF switch 88 to replace this incoming RF signal with the output of the VSB modulator and upconverter 84 through the transcoder output attenuator 90. Also, the controller 96 controls the tuner and VSB demodulator 74 to tune to the desired output RF channel (CH B). In addition, the controller 96 operates the clock and data baseband switch 94 to disconnect the clock and data lines at the output of the VSB receiver 70 from the input of the VSB transmitter 72 so that the VSB transmitter 72 runs independently. When the clock and data baseband switch 94 is open, the clock free-runs and "zero" data are inserted into the input of the VSB transmitter 72. This zero data can be used as a valid VSB "test" signal. This test signal is formed by the VSB encoder of the VSB modulator and upconverter 84 (normal VSB coding process includes randomization, Reed-Solomon coding, interleaving, and trellis-coding), which takes the "zero" data and converts it into a coded signal with both "ones" and "zeros." The taps of the pre-equalizer 82 (FIR filter) are loaded by the controller 96 with a single non-zero tap value, which represents an all-pass filter (in other words, it behaves the same as if the pre-equalizer 82 were bypassed). The output VSB signal of the VSB transmitter 72 is accurate (high SNR with open data eyes) because the critical signal processing (signal filtering, wave-shaping, and modulation) is performed digitally. Also, the final analog output of the VSB transmitter 72 has not been subjected to any linear (or non-linear) distortion by the high power amplifier and emission mask filter 66. The VSB receiver 70 processes the reference signal as it would any VSB signal, equalizing it to the highest quality signal (large SNR) as possible (except using a small step size in the equalization algorithm used to adapt the FIR filter, with the DFE filter turned off). Because the reference signal provided by the VSB transmitter 72 is very accurate, the taps of the adaptive equalizer 76 represent the correction of the analog "front-end" distortion caused by the tuner and VSB demodulator 74. These taps are called the "Self-Calibration" taps, and can be used to properly calibrate the VSB receiver 70 so that it is accurate when subsequently determining the emission mask filter correction taps.

Figure 5:
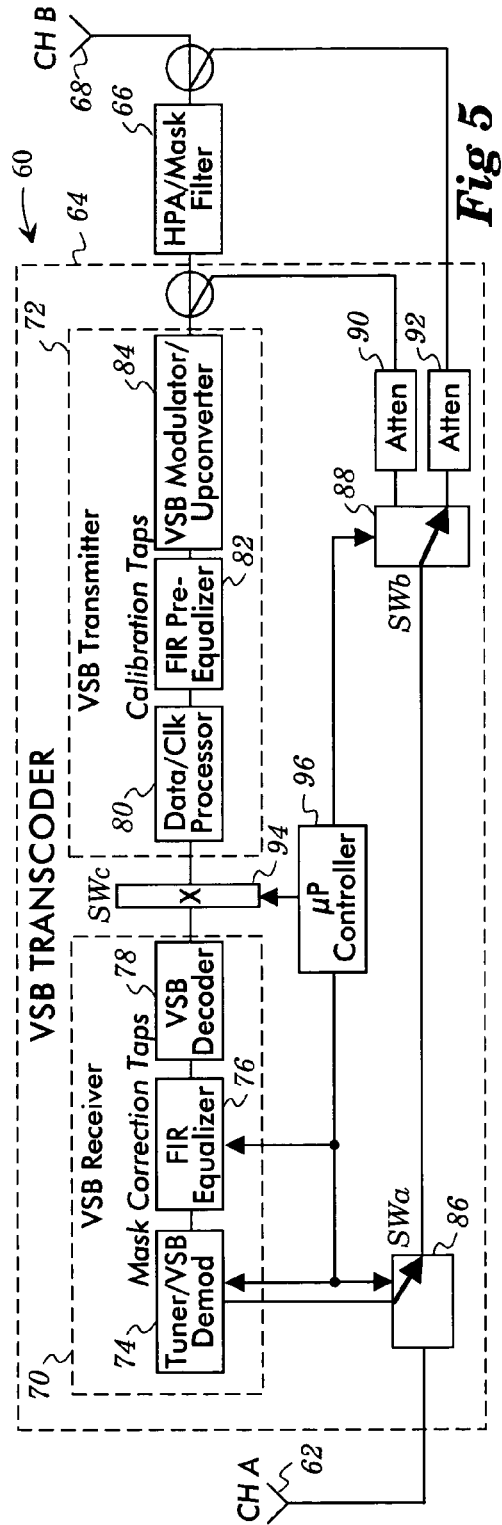
FIG. 5 illustrates the DTV translator of FIG. 3 configured for transferring the calibration taps of the receiver equalizer to the transmitter pre-equalizer to pre-distort the distortion caused by the tuner and for adjusting the taps of the receiver equalizer to correct for the distortion caused by the high power amplifier and mask emission filter of the DTV translator; and, FIG. 6 illustrates the DTV translator of FIG. 3 configured for verification of the pre-distortion operation of the DTV translator.

Step 2 (PRE-CORRECTION)—as illustrated in FIG. 5, the controller, continuing the pre-equalization process, loads or transfers (e.g., copies) the "Self-Calibration" taps from the adaptive equalizer 76 into the pre-equalizer 82 of the VSB transmitter 72. The input RF switch 86 remains in the position shown in FIG. 4 to disconnect the signal from the receive antenna 62, and the clock and data baseband switch 94 remains open to disconnect the clock and data from the VSB transmitter 72. However, the controller 96 operates the reference RF switch 88 to the position shown in FIG. 5 so as to connect the linearly distorted transmitter emission mask RF output from the output of the high power amplifier and emission mask filter 66 to the tuner and VSB demodulator 74. The tuner and VSB demodulator 74 is still tuned to the desired output RF channel (CH B). The taps of the adaptive equalizer 76 now adjust to correct for the distortion in the transmitter output signal caused by the high power amplifier and emission mask filter 66 while the pre-equalizer 82 compensates for inaccuracies in the reference receiver (i.e., in the tuner and VSB demodulator 74). Because this system as shown in FIG. 5 is a linear system, it does not matter if the receiver's self-calibration correction filter comes before or after the imperfect receiver analog circuitry. Because this pre-distorted VSB signal ("pre-calibrated" for the distortion caused by the tuner and VSB demodulator 74) passes through the high power amplifier and emission mask filter 66 and becomes further distorted, the adaptive equalizer 76 of the VSB receiver 70 equalizes the signal in a normal fashion, with the taps of the adaptive equalizer 76 of the VSB receiver 70 representing the correction for the linear distortion of the high power amplifier and emission mask filter 66 alone and not representing the imperfect distortion of the tuner and VSB demodulator 74.

Step 3 (FINALIZATION)—in this final pre-equalization step, the controller 96 loads or transfers (e.g., copies) the "mask correction" taps from the adaptive equalizer 76 to the pre-equalizer 82. Then, the controller 96 returns the VSB transcoder 64 to normal translator operation as originally illustrated in FIG. 3. However, the pre-equalizer 82 is now pre-corrected for the linear distortion caused by the high power amplifier and emission mask filter 66. The incoming RF signal from the receive antenna 62 is thus coupled by the input RF switch 86 to the tuner and VSB demodulator 74, and the clock and data baseband switch 94 is closed by the controller 96 so that the clock and data are connected to the VSB transmitter 72. Thus, data and clock once again pass from the VSB receiver 70 to the VSB transmitter 72. The internal transmitter reference signal from the output of the VSB modulator and upconverter 84 is arbitrarily connected by the reference RF switch 88 to the input RF switch 86, although the internal transmitter reference signal is not passed to the VSB receiver 70 at this time because the input RF switch 86 is coupled to supply the incoming RF signal from the antenna 62 to the VSB receiver 70. The tuner and VSB demodulator 74 is tuned to the desired input RF channel (CH A). With the "off-line" emission mask pre-equalization process complete, the VSB receiver 70 (with the help of the adaptive equalizer 76 and the forward error correction circuits of the VSB decoder 78) once again provides an error-free "live" MPEG transport data stream for VSB encoding, modulation, amplification, and mask filtering provided by the DTV translator 60 (assuming the CH A RF input signal is above the threshold of errors). The VSB-modulated signal is pre-distorted by the pre-equalizer 82 so that the signal at the output of the high power amplifier and emission mask filter 66 is relatively "pristine" (high SNR). Normal translator operation occurs until it is decided to perform another "off-line" pre-equalization.

Figure 6:
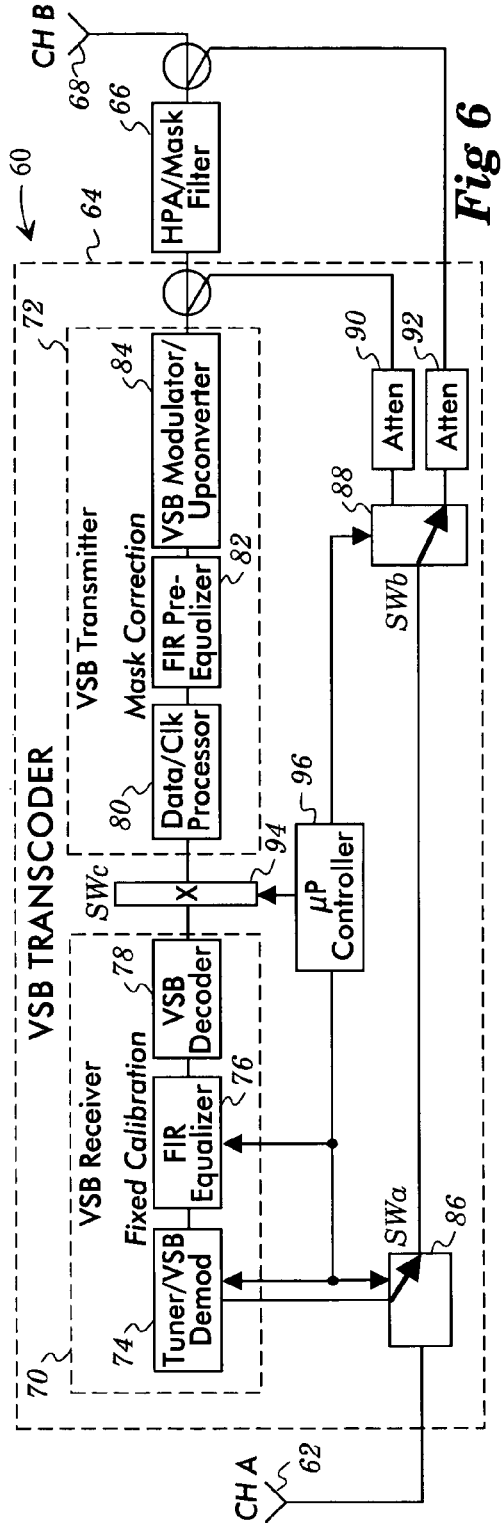

Step 4 (VERIFICATION)—this step is optional and is illustrated in FIG. 6. In this step, the controller 96 loads the original "Self-Calibration" taps determined and saved during step 1 back into the adaptive equalizer 76 of the VSB receiver 70 and "freezes" them (no adaptation on the input signal, thus turning the adaptive equalizer 76 into a fixed FIR filter). The "Mask Correction" taps are in the pre-equalizer 82 of the VSB transmitter 72 as part of normal translator operation (i.e., for correction for emission mask linear distortion). The input RF switch 86 is moved by the controller 96 to the position shown in FIG. 6, and the controller 96 opens the clock and data baseband switch 94 to disconnect the clock and data from the VSB transmitter 72. Also, the controller 96 operates the reference RF switch 88 so that the linearly-corrected transmitter emission mask RF output from the high power amplifier and emission mask filter 66 is coupled to the tuner and VSB demodulator 74 as shown in FIG. 6. The tuner and VSB demodulator 74 is tuned to the desired output RF channel (CH B). The linearly-corrected transmitter emission mask RF output from the high power amplifier and emission mask filter 66 is received and processed in the VSB receiver 70. However, the "frozen" adaptive equalizer 76 corrects only for the previously determined analog front-end distortion caused by the tuner and VSB demodulator 74. The signal quality (SNR) can be measured at the output of the adaptive equalizer 76 (just as it can in normal translator operation), which indicates the quality (SNR) of the signal at the mask output, thus giving a performance verification of mask correction.

Following verification, the DTV translator 60 is returned to normal operation where the controller 96 loads the taps of the adaptive equalizer 76 with the values that it had just prior to verification (or, alternatively, the taps of the adaptive equalizer 76 can simply be initialized to a single non-zero tap value) to allow normal adaptive operation, the controller sets the input RF switch 86 to couple the incoming signal from the receive antenna 62 to the tuner and VSB demodulator 74, the controller 96 arbitrarily sets the reference RF switch 88 to couple to the output of the VSB modulator and upconverter 84 through the transcoder output attenuator 90, and the controller 96 sets the clock and data baseband switch 94 to pass data and clock from the output of the VSB receiver 70 to the input of the VSB transmitter 72.

The embodiment of the present invention described above uses the existing receiver and transmitter circuits and the on-board microprocessor controller within a DTV translator to perform pre-correction, all with the addition of just a few passive components such as attenuators and switches. Other embodiments, however, may have more, fewer, and/or different components to achieve pre-correction without the use of an external reference receiver.

Certain other modifications of the present invention will occur to those practicing in the art of the present invention. For example, practical considerations must be made for the switches and the signal levels applied to them because isolation at UHF frequencies is not guaranteed to be in excess of 40 dB. Additional signal level controls can be added to the implementation described above, such as variable attenuators that allow large signal levels to be fed back to the tuner of the VSB receiver 70 during pre-equalization (to overcome any feedback leakage from the transmitter output antenna to the receiver input antenna) yet reduce this signal to the input of the input RF switch 86 to avoid self-interference during normal operation. One advantage that DTV translators have over on-channel DTV repeaters is the fact that there should be no outgoing (output) signal on the same channel frequency as an incoming (input) channel, thus avoiding some potential problems.

However, it is possible to apply the pre-correction methodology described above to on-channel repeaters or single frequency network repeaters where the input and output channels are the same.

Moreover, the emission mask filter can be manually adjusted to output different channels (for example, over half of the UHF channels).

Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

We claim:

1. A method of per-correcting a DTV translator for distortion produced by a high power amplifier and emission mask filter of the DTV translator, the DTV translator having a receiver and a transmitter, the method comprising:
   coupling an output of the high power amplifier and emission mask filter to the receiver;
   tuning the receiver from a frequency at an input of the DTV translator to a different frequency at the output of the high power amplifier and emission mask filter so that the receiver determines a compensation of the distortion produced by the high power amplifier and emission mask filter of the DTV translator in response to the tuned signal; and
   transferring the compensation of the distortion from the receiver to the transmitter so as to pre-correct the DTV translator for the distortion.

2. The method of claim 1 further comprising de-coupling the receiver and the transmitter during the coupling of an output of the high power amplifier and emission mask filter to the receiver and the tuning of the receiver to the output of the high power amplifier and emission mask filter.

3. The method of claim 1 wherein the receiver includes an equalizer, wherein the transmitter includes a pre-equalizer, wherein the tuning of the receiver to the output of the high power amplifier and emission mask filter comprises tuning the receiver to the output of the high power amplifier and emission mask filter such that the equalizer adapts to the tuned signal, and wherein the transferring of the compensation of distortion from the receiver to the transmitter comprises transferring tap values from the equalizer to the pre-equalizer.

4. The method of claim 3 further comprising de-coupling the receiver and the transmitter during the coupling of an output of the high power amplifier and emission mask filter to the receiver, the tuning of the receiver to the output of the high power amplifier and emission mask filter, and the transferring of tap values from the equalizer to the pre-equalizer.

5. The method or claim 1 further comprising using the receiver for verifying performance of the DTV translator.

6. A method of pro-correcting a DTV translator for distortion produced by a high power amplifier and emission mask filter of the DTV translator, the DTV translator having a receiver and a transmitter, the method comprising:
   coupling an output of the transmitter to the receiver;
   tuning the receiver to the output of the transmitter;
   calibrating the receiver in response to the tuned transmitter output signal;
   transferring the calibration to the transmitter;
   coupling an output of the high power amplifier and emission mask filter to the receiver;
   tuning the receiver to the output of the high power amplifier and emission mask filter; and,
   pre-correcting the DTV translator in response to the tuned high power amplifier and emission mask filter output signal.

7. The method of claim 6 further comprising de-coupling the receiver and the transmitter during the coupling of an output of the transmitter to the receiver, the tuning of the receiver to the output of the transmitter, the calibrating of the receiver in response to the tuned transmitter output signal, the transferring of the calibration to the transmitter, the coupling of an output of the high power amplifier and emission mask filter to the receiver, the tuning of the receiver to the output of the high power amplifier and emission mask filter, and the pre-correcting of the DTV translator in response to the tuned high power amplifier and emission mask filter output signal.

8. The method of claim 6 wherein the receiver includes an equalizer, wherein the transmitter includes a pre-equalizer, wherein the calibrating of the receiver in response to the tuned transmitter output signal comprises calibrating the receiver in response to the tuned transmitter output signal such that the equalizer adapts to the tuned transmitter output signal, wherein the transferring of the calibration to the transmitter comprises transferring tap values from the equalizer to the pre-equalizer, wherein the tuning of the receiver to the output of the high power amplifier arid emission mask filter comprises tuning the receiver to the output of the high power amplifier and emission mask filter such that the equalizer adapts to the tuned high power amplifier and emission mask filter output signal, and wherein the pre-correcting of the DTV translator comprises transferring tap values from the equalizer to the pre-equalizer.

9. The method of claim 8 further comprising de-coupling the receiver and the transmitter during the coupling of an output of the transmitter to the receiver, the tuning of the receiver to the output of the transmitter, the calibrating of the receiver in response to the tuned transmitter output signal, the transferring of the tap values from the equalizer to the pre-equalizer, the coupling of an output of the high power amplifier and emission mask filter to the receiver, the tuning of the receiver to the output of the high power amplifier and emission mask filter, and the transferring of tap values from the equalizer to the pre-equalizer.

10. The method of claim 6 further comprising:
reloading and freezing the calibration back into the equalizer; and,
verifying performance of the DTV translator based on the calibrated receiver and the pre-distorted transmitter.

11. The method of claim 10 further comprising de-coupling the receiver end the transmitter during the coupling of an output of the transmitter to the receiver, the tuning of the receiver to the output of the transmitter, the calibrating of the receiver in response to the tuned transmitter output signal, the transferring of the calibration to the transmitter, the coupling of an output of the high power amplifier and emission mask filter to the receiver, the tuning of the receiver to the output of the high power amplifier and emission mask filter, and the pre-correcting of the DTV translator in response to the tuned high power amplifier and emission mask filter output signal.

12. The method of claim 10 wherein the receiver includes an equalizer, wherein the transmitter includes a pre-equalizer, wherein the calibrating of the receiver in response to the tuned transmitter output signal comprises calibrating the receiver in response to the tuned transmitter output signal such that the equalizer adapts to the tuned transmitter output signal, wherein the transferring of the calibration to the transmitter comprises transferring tap values from the equalizer to the pre-equalizer, wherein the tuning the receiver to the output of the high power amplifier and emission mask filter comprises tuning the receiver to the output of the high power amplifier and emission mask filter such that the equalizer adapts to the tuned high power amplifier and emission mask filter output signal, and wherein the pre-correcting of the DTV translator comprises transferring tap values from the equalizer to the pre-equalizer.

13. The method of claim 12 further comprising de-coupling the receiver and the transmitter during the coupling of an output of the transmitter to the receiver, the tuning of the receiver to the output of the transmitter, the calibrating of the receiver in response to the tuned transmitter output signal, the transferring of the tap values from the equalizer to the pre-equalizer, the coupling of an output of the high power amplifier and emission mask filter to the receiver, the tuning of the receiver to the output of the high power amplifier and emission mask filter, and the transferring of tap values from the equalizer to the pre-equalizer.

14. A DTV translator for use with a receiving antenna and a transmitting antenna comprising:
a receiver including a tuner and an equalizer;
a transmitter including a pre-equalizer and a transmitter output;
a high power amplifier and emission mask filter coupled to the transmitter output and having a high power amplifier and emission mask filter output;
a first switch coupled to the tuner and adapted to be coupled the receiving antenna;
a second switch coupled to the transmitter output, to the high power amplifier and emission mask filter output, and to the first switch;
a third switch coupled between the receiver and the transmitter; and,
a controller, wherein the controller during normal operation tunes the tuner to a received channel and operates the first and third switches to couple the receiving antenna to the tuner and to couple the receiver to the transmitter, and wherein the controller during a set-up operation (i) operates the first, second, and third switches to couple the transmitter output to the tuner and to disconnect the receiver from the transmitter, (ii) operates the tuner to tune to the transmitter output such that taps of the equalizer adjust to calibration values that reduce receiver related distortion, (iii) transfers the calibration values from the equalizer to the taps of the pre-equalizer, (iv) operates the first, second, and third switches to couple the high power amplifier and emission mask filter output to the tuner and to disconnect the receiver from the transmitter, (v) operates the tuner to tune to the high power amplifier and emission mask filter output such that the taps of the equalizer adjust to pre-distortion values that reduce high power amplifier and emission mask filter related distortion, and (vi) transfers the pre-distortion values from the equalizer to the taps of the pre-equalizer.

15. The DTV translator of claim 14 wherein the controller further (vii) operates the first, second, and third switches to couple the high power amplifier and emission mask filter output to the tuner and to disconnect the receiver from the transmitter, (viii) tunes the tuner to the high power amplifier and emission mask filter output, (ix) loads calibration values into the equalizer and freezes the taps of the equalizer at the calibration values, arid (x) determines signal quality at the output of the receiver.

16. The DTV translator of claim 14 wherein the receiver includes a VSB decoder, wherein the equalizer is coupled between the tuner and the VSB decoder, wherein the transmitter includes a data and clock processor and a VSB modulator and upconverter, and wherein the pre-equalizer is coupled between the data and clock processor and the VSB modulator end upconverter.

17. The DTV translator of claim 16 wherein the data and clock processor revises the virtual channel data packet and locks the transmitter symbol clock to the incoming symbol clock.

18. The DTV translator of claim 16 wherein the controller further (vii) operates the first, second, and third switches to couple the high power amplifier and emission mask filter output to the tuner and to disconnect the receiver from the transmitter, (viii) tunes the tuner to the high power amplifier and emission mask filter output, (ix) loads calibration values into the equalizer and freezes the taps of the equalizer at the calibration values, and (x) determines signal quality at the output of the receiver.

19. The DTV translator of claim 18 wherein the data and clock processor revises the virtual channel data packet and locks the transmitter symbol clock to the incoming symbol clock.

20. A method of pre-correcting a DTV translator for distortion produced by a distortion causing device of the DTV translator, the DTV translator having a receiver and a transmitter, the method comprising:
coupling an output of the transmitter to the receiver so as to exclude the output of the distortion causing device from the coupling of the output of the transmitter to the receiver;
tuning the receiver to the output of the transmitter;
calibrating the receiver in response to the tuned transmitter output signal;
transferring the calibration to the transmitter;
coupling the output of the distortion causing device to the receiver; and,
pre-correcting the DTV translator in response to the output of the distortion causing device.

21. The method of claim 20 wherein the pre-correcting of the DTV translator in response to the output of the distortion causing device comprises:
calibrating the receiver in response to the output of the distortion causing device; and,
transferring to the transmitter the calibration of the receiver in response to the output of the distortion causing device.

22. The method of claim 20 further comprising disconnecting an output of the receiver from an input of the transmitter prior to the coupling of an output of the transmitter to the receiver so as to exclude the output of the distortion causing device from the coupling of the output of the transmitter to the receiver.

23. The method of claim 22 wherein the pre-correcting of the DTV translator in response to the output of the distortion causing device comprises:
calibrating the receiver in response to the output of the distortion causing device;
transferring to the transmitter the calibration of the receiver in response to the output of the distortion causing device; and,
re-connecting the output of the receiver to the input of the transmitter following transferring to the transmitter of the calibration of the receiver in response to the output of the distortion causing device.

* * * * *